(12) United States Patent
Yuzawa et al.

(10) Patent No.: US 10,658,325 B2
(45) Date of Patent: *May 19, 2020

(54) SEMICONDUCTOR DEVICE INCLUDING A BUFFER LAYER STRUCTURE FOR REDUCING STRESS

(71) Applicant: SEIKO EPSON CORPORATION, Tokyo (JP)

(72) Inventors: Takeshi Yuzawa, Chino (JP); Masatoshi Tagaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/132,839

(22) Filed: Sep. 17, 2018

(65) Prior Publication Data

US 2019/0019773 A1   Jan. 17, 2019

Related U.S. Application Data

(63) Continuation of application No. 15/813,649, filed on Nov. 15, 2017, now Pat. No. 10,103,120, which is a (Continued)

(30) Foreign Application Priority Data

May 2, 2006   (JP) .................................. 2006-128360

(51) Int. Cl.
*H01L 29/40* (2006.01)
*H01L 21/44* (2006.01)
(Continued)

(52) U.S. Cl.
CPC ............ *H01L 24/29* (2013.01); *H01L 23/481* (2013.01); *H01L 23/49811* (2013.01);
(Continued)

(58) Field of Classification Search
CPC .................................................. H01L 23/49811
(Continued)

(56) References Cited

U.S. PATENT DOCUMENTS 4,777,061 A   10/1988 Wu et al.
5,084,752 A   1/1992 Satoh et al.
(Continued)

FOREIGN PATENT DOCUMENTS

JP   S57-141932 A   9/1982
JP   H03-131044 A   6/1991
(Continued)

OTHER PUBLICATIONS

Mar. 28, 2017 Office Action issued in U.S. Appl. No. 15/342,675.
Jul. 5, 2016 Office Action Issued in U.S. Appl. No. 15/084,038.
Mar. 5, 2018 Office Action issued in U.S. Appl. No. 15/813,649.

*Primary Examiner* — Calvin Lee
(74) *Attorney, Agent, or Firm* — Oliff PLC

(57) ABSTRACT

A semiconductor device includes a semiconductor chip, wiring that is included in the semiconductor chip and his a coupling part between parts with different widths, a pad being formed above the wiring and in a position overlapping the coupling part, a bump being formed on the pad, a buffer layer being formed in a position between the coupling part and the pad so as to cover the entire couple part, and inorganic insulating layers being formed between the wiring and the buffer layer and between the buffer layer and the pad, respectively. The buffer layer is made of a material other than resin and softer than the inorganic insulating layer.

2 Claims, 5 Drawing Sheets

Related U.S. Application Data continuation of application No. 15/342,675, filed on Nov. 3, 2016, now Pat. No. 9,842,821, which is a continuation of application No. 15/084,038, filed on Mar. 29, 2016, now Pat. No. 9,515,043, which is a continuation of application No. 14/746,183, filed on Jun. 22, 2015, now Pat. No. 9,331,039, which is a continuation of application No. 14/581,518, filed on Dec. 23, 2014, now Pat. No. 9,093,334, which is a continuation of application No. 14/252,047, filed on Apr. 14, 2014, now Pat. No. 8,952,554, which is a continuation of application No. 14/067,404, filed on Oct. 30, 2013, now Pat. No. 8,742,601, which is a continuation of application No. 11/738,266, filed on Apr. 20, 2007, now Pat. No. 8,614,513.

(51) Int. Cl.
| | | |
|---|---|---|
| *H01L 23/00* | (2006.01) | |
| *H01L 23/498* | (2006.01) | |
| *H01L 23/48* | (2006.01) | |
| *H01L 23/528* | (2006.01) | |
| *H01L 23/532* | (2006.01) | |

(52) U.S. Cl.
CPC ........ *H01L 23/528* (2013.01); *H01L 23/5283* (2013.01); *H01L 23/53214* (2013.01); *H01L 23/53219* (2013.01); *H01L 24/05* (2013.01); *H01L 2224/05687* (2013.01); *H01L 2224/13144* (2013.01); *H01L 2924/05042* (2013.01); *H01L 2924/35* (2013.01)

(58) Field of Classification Search
USPC ......... 438/617, 613; 257/782–786, 775, 758, 257/737, 700
See application file for complete search history.

(56) References Cited

U.S. PATENT DOCUMENTS

| | | | |
|---|---|---|---|
| 5,288,661 | A | 2/1994 | Satoh et al. |
| 5,751,065 | A | 5/1998 | Chittipeddi et al. |
| 5,999,726 | A | 12/1999 | Ho |
| 6,255,729 | B1 | 7/2001 | Oikawa |
| 6,734,093 | B1 | 5/2004 | Sabin et al. |
| 6,780,757 | B2 | 8/2004 | Suzuki et al. |
| 6,998,335 | B2 | 2/2006 | Fan et al. |
| 7,511,363 | B2 | 3/2009 | Akram |
| 7,626,268 | B2 | 12/2009 | Goebel et al. |
| 7,741,716 | B1 | 6/2010 | Venkitachalam et al. |
| 8,614,513 | B2 * | 12/2013 | Yuzawa ................ H01L 23/522 257/784 |
| 8,742,601 | B2 * | 6/2014 | Yuzawa ................ H01L 23/522 257/784 |
| 8,952,554 | B2 * | 2/2015 | Yuzawa ................ H01L 23/522 257/784 |
| 9,093,334 | B2 * | 7/2015 | Yuzawa ................ H01L 23/522 257/784 |
| 9,331,039 | B2 * | 5/2016 | Yuzawa ................ H01L 23/522 257/784 |
| 9,515,043 | B2 * | 12/2016 | Yuzawa ................ H01L 23/522 257/784 |
| 9,842,821 | B2 * | 12/2017 | Yuzawa ................ H01L 23/522 257/784 |
| 10,103,120 | B2 * | 10/2018 | Yuzawa ................ H01L 23/522 257/784 |

FOREIGN PATENT DOCUMENTS

| | | |
|---|---|---|
| JP | H11-307724 A | 11/1999 |
| JP | 2002-319587 A | 10/2002 |
| JP | 2005-347622 A | 12/2005 |

\* cited by examiner

SEMICONDUCTOR DEVICE INCLUDING A BUFFER LAYER STRUCTURE FOR REDUCING STRESS

This application is a continuation of U.S. patent application Ser. No. 15/813,649, filed on Nov. 15, 2007, now U.S. Pat. No. 10,103,120 issued Oct. 16, 2018, which is a continuation of U.S. patent application Ser. No. 15/342,675, filed Nov. 3, 2016, now U.S. Pat. No. 9,842,821 issued Dec. 12, 2017, which is a continuation of U.S. patent application Ser. No. 15/084,038, filed Mar. 29, 2016, now U.S. Pat. No. 9,515,043 issued Dec. 6, 2016, which is a continuation of U.S. patent application Ser. No. 14/746,183, filed Jun. 22, 2015, now U.S. Pat. No. 9,331,039 issued May 3, 2016, which is a continuation of U.S. patent application Ser. No. 14/581,518 filed Dec. 23, 2014, now U.S. Pat. No. 9,093,334 issued Jul. 28, 2015, which is a continuation of U.S. patent application Ser. No. 14/252,047 filed Apr. 14, 2014, now U.S. Pat. No. 8,952,554 issued Feb. 10, 2015, which is a continuation of U.S. patent application Ser. No. 14/067,404 filed Oct. 30, 2013, now U.S. Pat. No. 8,742,601 issued Jun. 3, 2014, which is a continuation of U.S. patent application Ser. No. 11/738,266 filed on Apr. 20, 2007, now U.S. Pat. No. 8,614,513 issued Dec. 24, 2013, which claims priority to Japanese Patent Application No. 2006-128360 filed on May 2, 2006, the entire disclosures of which are expressly incorporated by reference herein.

The present invention relates to a semiconductor device.

RELATED ART

A semiconductor chip as an integrated circuit chip includes multilayered wiring. Some pieces of wiring have a part with a large width and a part with a small width. Intensive stress is apt to be applied to a coupling part between such parts with different widths. In particular, since polysilicon wiring drawn out of a gate electrode formed in a lowermost layer of a semiconductor chip has poorer ductility than metal, there has been a problem that a crack is apt to occur in a coupling part of the polysilicon wiring, thereby causing a break. Resistive elements, which are made of polysilicon as well, have had a similar problem. For example, see JP-A-2002-319587.

SUMMARY

An advantage of the invention is to reduce stress to be applied to a coupling part between parts with different widths of wiring or a resistive element.

(1) According to an aspect of the invention, a semiconductor device includes a semiconductor chip, wiring that: is included in the semiconductor chip and has a coupling part between parts with different widths, a pad being formed above the wiring and in a position overlapping the coupling part, a bump being formed on the pad, a buffer layer being formed in a position between the coupling part and the pad so as to cover the entire coupling part, and inorganic insulating layers being formed between the wiring and the buffer layer and between the buffer layer and the pad, respectively. The buffer layer is made of a material other than resin and softer than the inorganic insulating layer.

According to the aspect of the invention, even though a force is applied to the coupling part between the parts with different widths by the bump, the force is absorbed by the buffer layer. This allows less stress to be applied to the coupling part.

(2) In the semiconductor device according to the aspect of the invention, the wiring may be used as a resistive element.

(3) In the semiconductor device according to the aspect of the invention, the buffer layer may be made or e conductive material and electrically coupled to the wiring.

(4) In the semiconductor device according to the aspect of the invention, the wiring may be made of polysilicon.

BRIEF DESCRIPTION OF THE DRAWINGS

The invention will be described with reference to the accompanying drawings, wherein like numbers reference like elements.

FIG. 3A is a sectional view taken along line IIIA-IIIA of FIG. 3B.

DESCRIPTION OF EXEMPLARY EMBODIMENTS

Embodiments of the invention will now be described with reference to the accompanying drawing.

First Embodiment

Figure 1A:
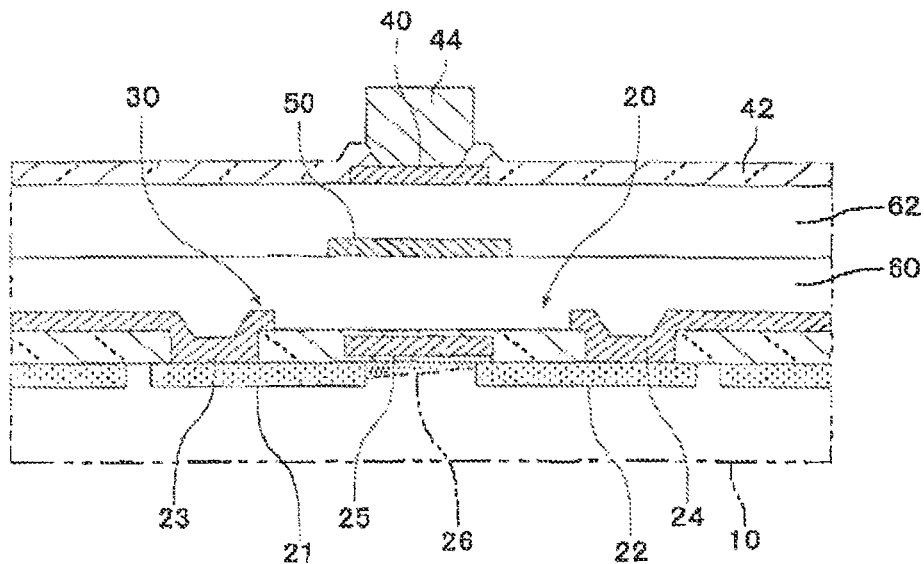
FIG. 1A is a sectional view showing a part of a semiconductor device according to a first embodiment of the invention.
Figure 1B:
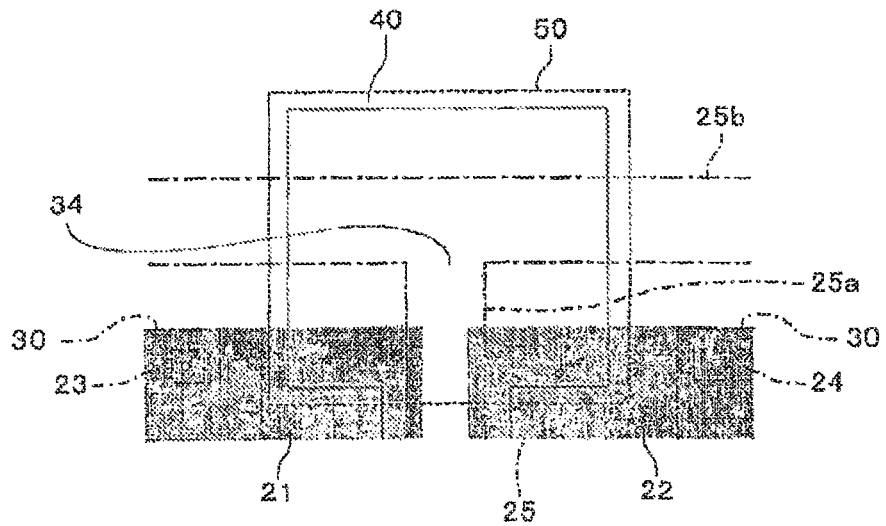
FIG. 1B is s plan view showing a part of the semiconductor device shown in FIG. 1A.

FIG. 1A is a sectional view showing a part of a semiconductor device according to a first embodiment of the invention. FIG. 1B is a plan view showing a part of the semiconductor device shown in FIG. 1A. A semiconductor chip 10 includes an integrated circuit (for example, field-effect transistor 20).

The field-effect transistor 20 includes diffusion layers 21, 22 serving as source and a drain, contact parts 23, 24 for making contact with the diffusion layers 21, 22, and a gate electrode 25. Applying a voltage to the gate electrode 25 forms a channel 26 to pass current.

The semiconductor chip 10 includes wiring 30 that is coupled to the diffusion layers 21, 22 serving as a source and a drain via the contact parts 23, 24.

Figure 2A:
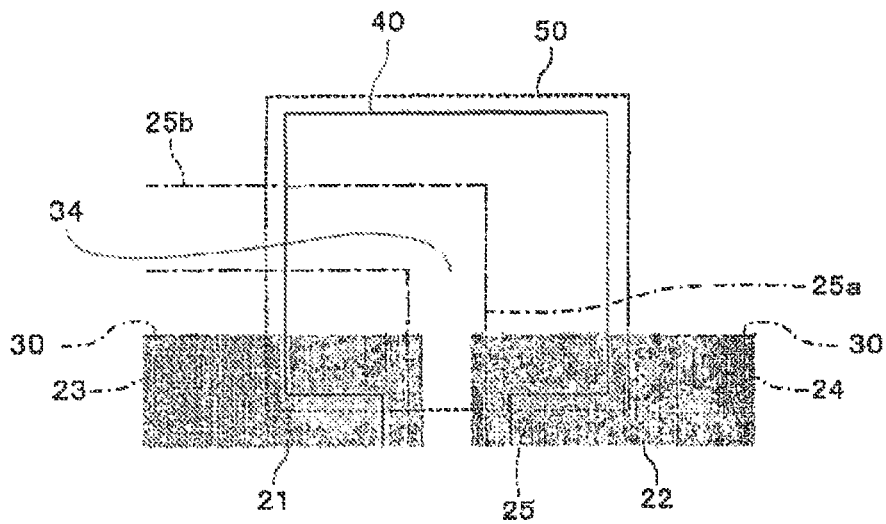
FIGS. 2A and 2B show modifications of the semiconductor device shown in FIG. 1B.
Figure 2B:
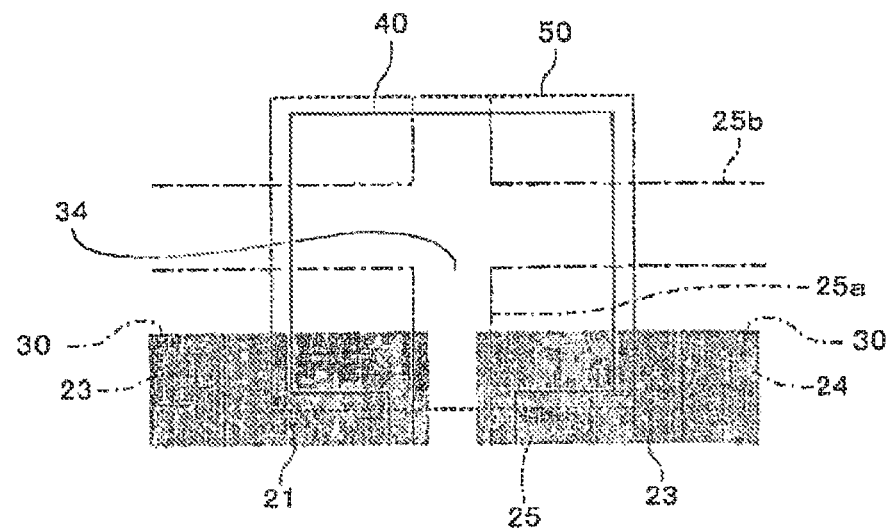

The semiconductor chip 10 includes first wiring 25a that is coupled to the gate electrode 25 and has a first width, second wiring 25b that has a second width, and a coupling part 34 between the first wiring 25a and second wiring 25b. The first width is smaller than the second width. The first wiring 25a, second wiring 25b, and coupling part 34 may a form a T shape as shown in FIG. 1B, an L shape as a modification as shown in FIG. 2A, or a cross as shown in FIG. 2B. The first wiring 25a and second wiring 25b may be made of polysilicon, aluminum (Al), aluminum alloy, or the like. The first wring 25a and second wiring 25b may be made of polysilicon and then used as resistive elements. It is known that application of a force to the first wiring 25a and second wiring 25b which have different widths causes intensive stress to be applied to the coupling part 34.

Disposed in a position (above the coupling part 34) overlapping the coupling part 34 is a pad 40 that is electrically coupled to the integrated circuit. The pad 40 may include in an uppermost layer thereof a barrier metal layer made of TiN, TiW, or the like. Such a barrier metal layer can prevent the material of a component formed thereon from diffusing into the pad 40. The pad 40 can be formed by sputtering.

Wiring that includes the pad 40 as a part thereof is covered with a passivation film 42 except for at least a part of the pad 40 (e.g. center part). The passivation film 42 is made of an inorganic material such as $SiO_2$ or SiN. It is known that inorganic materials are harder then metal such as Au or Al.

Formed on the pad 40 is a bump 44 that is made of metal such as Au. Au is softer than TiN or TiW. The bump 44 may partially be placed on the passivation film 42 and can be formed by electrolytic placing.

Disposed between the coupling part 34 and pad 40 is a buffer layer 50 that is formed so as to cover the entire coupling part 34. Formed between the first wiring 25a and second wiring 25b and the buffer layer 50 and between the buffer layer 50 and pad 40 are inorganic insulating layers 60 and 62, respectively. The inorganic insulating layers 60 and 62 are made of an inorganic material such as an oxide film. Inorganic materials are known to be harder than metal such as Au or Al. The buffer layer 50 is made of a material (e.g. metal) other than resin and softer than the inorganic insulating layers 60 and 62. The buffer layer 50 may be made of a material identical to at least any one of the wiring 30 and pad 40.

According to this embodiment, even though a force is applied to the coupling part 34 between the parts with different widths by the bump 44, the force is absorbed by the buffer layer 50. This allows less strew to be applied to the coupling part 34.

Second Embodiment

Figure 3A:
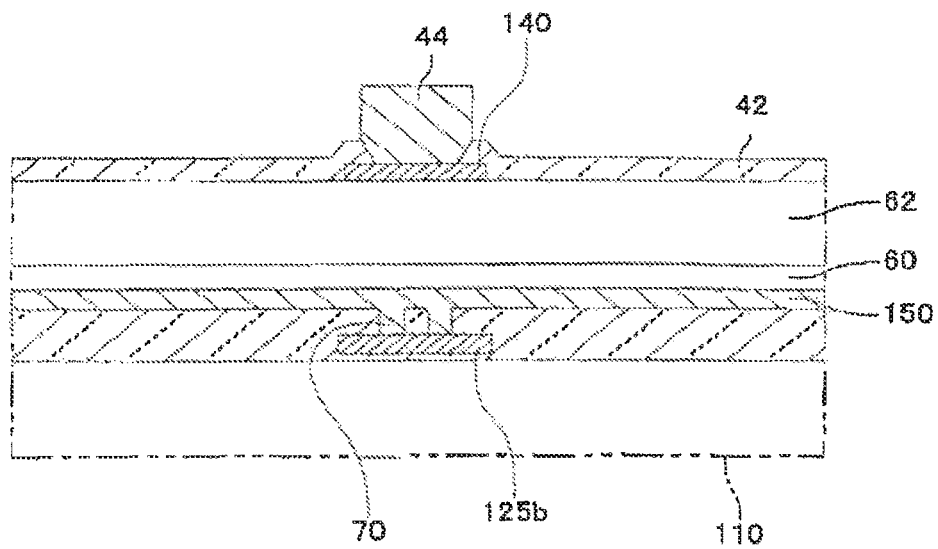
FIGS. 3A and 3B are drawings showing a semiconductor device according to a second embodiment of the invention.
Figure 3B:
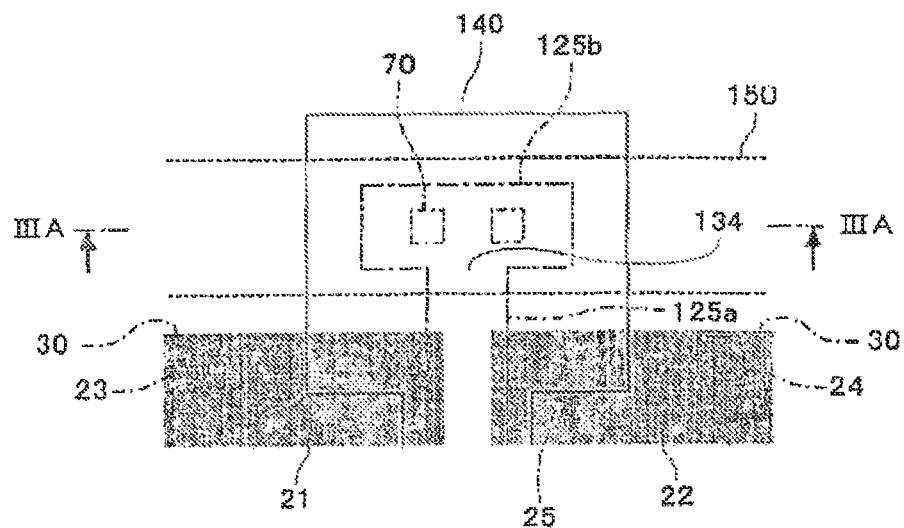

FIG. 3A is a sectional view showing a part of a semiconductor device according to a second embodiment of the invention. FIG. 3B is a plan view showing a part of the semiconductor device shown in FIG. 3A. Specifically, FIG. 3A is a sectional view taken along line IIIA-IIIA of FIG. 3B.

The semiconductor device 110 according to this embodiment includes first wiring 125a that has a first width, second wiring 125b that has a second width, and a coupling part 134 between the first wiring 125a and second wiring 125b.

A buffer layer 150 is made of a conductive material and electrically coupled to the second wiring 125b. Specifically, a contact part 70 is disposed between the buffer layer 150 and second wiring 125b so as to electrically couple them. The second width of the second wiring 125b is made larger than the first width of the first wiring 125a so as to dispose the contact part 70 on the second wiring 125b. The buffer layer 150 is formed so as to cover the coupling part 134. The buffer is formed between the coupling part 134 and pad 140. Other features correspond to those described in the above-mentioned embodiment. The same goes for the operation and effect of this embodiment.

Third Embodiment

Figure 4A:
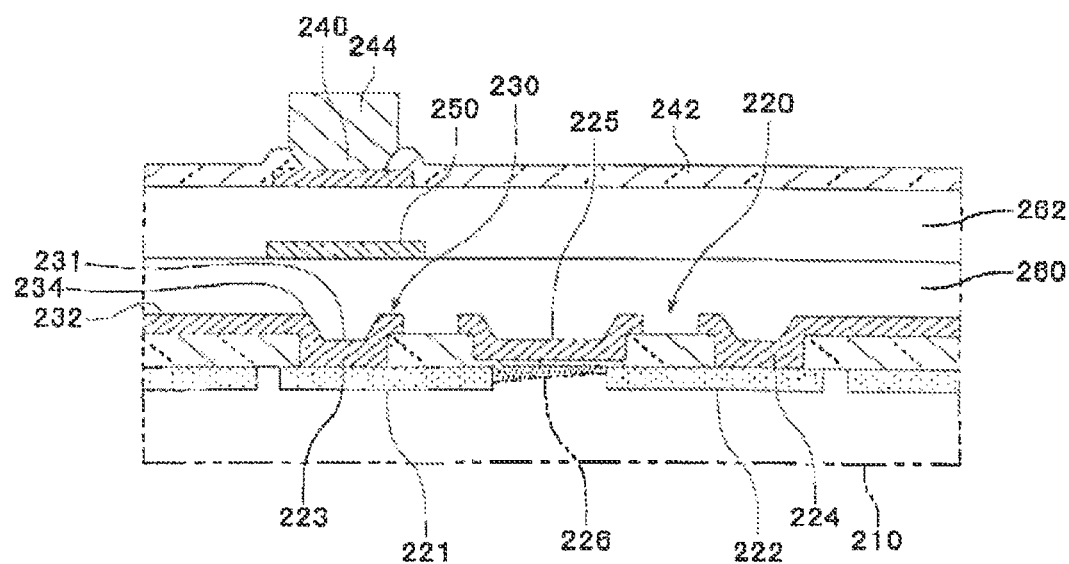
FIG. 4A is a sectional view showing a part of a semiconductor device according to a third embodiment of the invention.
Figure 4B:
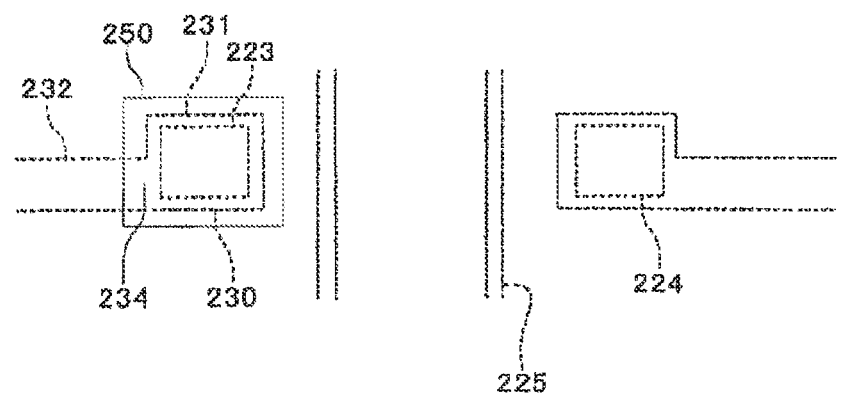
FIG. 4B is a plan view showing a part of the semiconductor device shown in FIG. 4A.

FIG. 4A is a sectional view showing a part of a semiconductor device according to a third embodiment of the invention. FIG. 45 is a plan view showing a part of the semiconductor device shown in FIG. 4A. The semiconductor device according to this embodiment includes a semiconductor chip 210. The semiconductor chip 210 includes an integrated circuit (e.g. field-effect transistor 220).

The field-effect transistor 320 includes diffusion layers 221, 222 serving as a source and a drain, contact parts 223, 224 for making contact with the diffusion layers 221, 222, and a gate electrode 225. Applying a voltage to the gate electrode 225 forms a channel 226 to pass current.

The semiconductor chip 210 includes wiring 230 that has parts 231, 232 with different widths and a coupling part 234 between these parts. The part 232 with a smaller width is a wiring line. The contact part 223 is disposed on the part 231 with a larger width. The parts 231, 232 with different widths and the coupling part 234 may form any of an L shape, a T shape, and a cross. It is known that application of a force to the wiring 230 having the parts 231, 232 with different widths causes intensive stress to be applied to the coupling part 234.

Disposed in a position (above the coupling part 234) overlapping the coupling part 234 is a pad 240 that is electrically coupled to the integrated circuit. The pad 240 may include in an uppermost layer thereof a barrier metal layer made of TiN, TiW, or the like. The barrier metal layer can prevent the material of a component formed thereon from diffusing into the pad 240. The pad 240 can be formed by sputtering.

Wiring that includes the pad 240 as a part thereof is covered with a passivation film 242 except for at least a part of the pad 240 (e.g. center part). The passivation film 242 is made of an inorganic material such as $SiO_2$ or SiN. It is known that inorganic materials are harder than metal such as Au or Al.

Formed on the pad 240 is a bump 244 that is made of metal such as Au, Au is softer than TiN or TiW. The bump 244 may partially be placed on the passivation film 242 and can be formed by electrolytic plating.

Disposed between the coupling part 234 and pad 240 is a buffer layer 250 that, is formed so as to cover the entire coupling part 234. Formed between the wiring 230 and buffer layer 250 and between the buffer layer 250 and pad 240 are inorganic insulating layers 260 and 202, respectively. The inorganic insulating layers 260 and 262 are made of an inorganic material such as an oxide film. Inorganic materials are known to be harder than Au or Al. The buffer layer 250 is made of a material (e.g. metal) other than resin and softer than the inorganic insulating layers 260 and 262. The buffer layer 250 may be made of an identical material to at least any one of the wiring 230 and pad 240.

According to this embodiment, even though a force is applied to the coupling part 234 between the parts with different widths by the bump 244, the force is absorbed by the buffer layer 250. This allows leas stress to be applied to the coupling part 234.

Fourth Embodiment

Figure 5A:
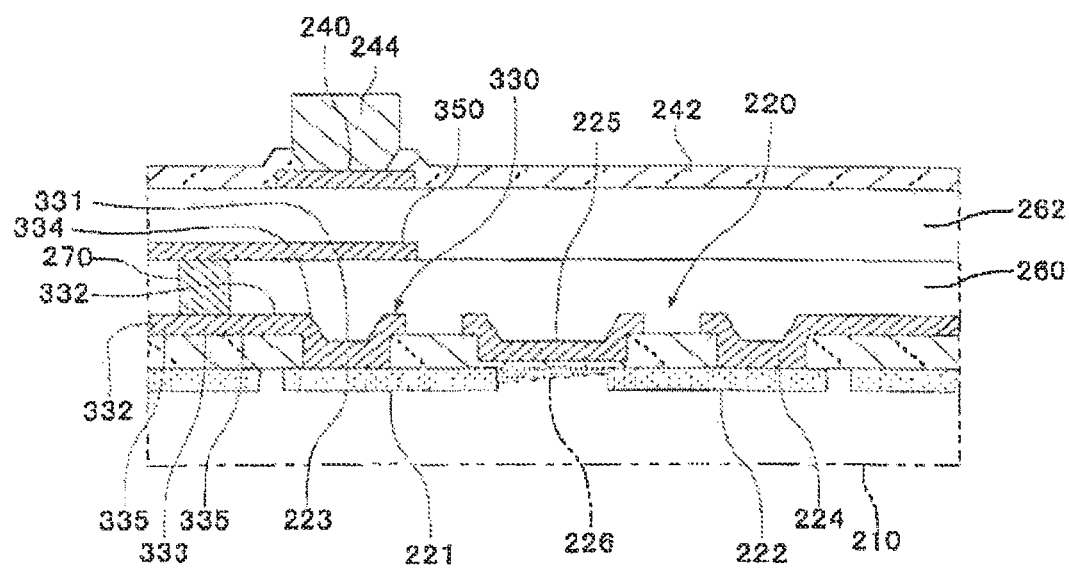
FIG. 5A is a sectional view showing a part of a semiconductor device according to a fourth embodiment of the invention.
Figure 5B:
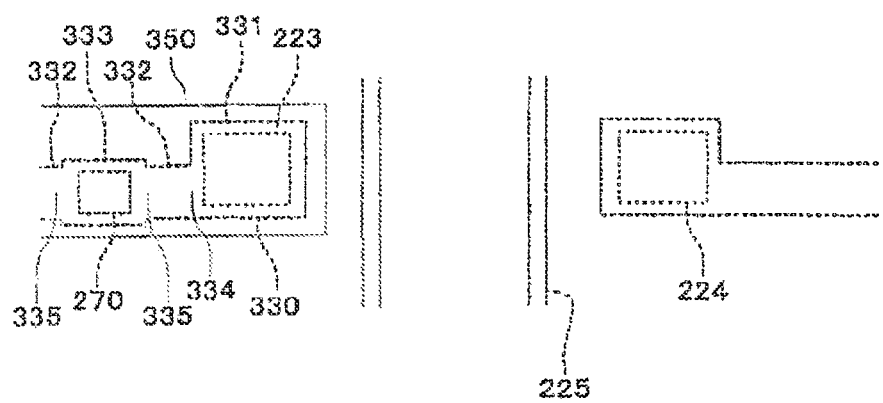
FIG. 5B is a plan view showing a pert of the semiconductor device shown in FIG. 6A.

FIG. 5A is a sectional view showing a part of a semiconductor device according to a fourth embodiment of the invention. FIG. 5B is a plan view showing a part of the semiconductor device shown in FIG. 5A.

In this embodiment, a buffer layer 350 is made of a conductive material and electrically coupled to wiring 330. Specifically, a contact pert 270 is disposed between the buffer layer 350 and the wiring 330 so as to electrically couple them. The wiring 330 includes a first coupling part 334 between parts 331, 332 with different widths and a second contact part 335 between the part 332 and a part 333 that have different widths. Among the parts 332, 333, the part 333 has a larger width than that of the part 332 to dispose the contact part 270. The buffer layer 350 is formed so as to entirely cover both the first and second coupling parts 384, 335. Other features correspond to those described in the abovementioned embodiments. The same goes for the operation and effect of this embodiment.

The invention is not limited to the abovementioned embodiments and various modifications can be made to these embodiments. For example, the invention includes features substantially identical to those described in the embodiments (for example, an identical feature in function, method, and result, or an identical feature in objective and result). The invention also includes features in which any nonessential part of the features described in the embodiments is replaced. The invention also includes features in which operation and effect identical to those described in the embodiments are demonstrated, or features in which objectives identical to those described in the embodiments can be achieved. The invention also includes features in which a well known technology is added to the features described in the embodiments.

What is claimed is:

1. A semiconductor chip, comprising:

a pad;

lower wiring, first and second portions of the lower wiring having different widths and being connected together at a junction;

conductive material between the junction and the pad;

a diffusion layer;

a first contact part for contacting the diffusion layer and the lower wiring;

upper wiring disposed above the lower wiring; and a second contact part for contacting the lower wiring and the upper wiring, wherein the pad is above the junction, the diffusion layer is below the lower wiring, and the conductive material overlaps the pad, the junction, the first contact part, and the diffusion layer in a plan view from above the pad.

2. A semiconductor device comprising the semiconductor chip of claim 1.

* * * * *